(12) United States Patent
Dross

(10) Patent No.: US 10,317,579 B2
(45) Date of Patent: Jun. 11, 2019

(54) OPTICAL DEVICE WITH A COLLIMATOR AND LENSLET ARRAYS

(71) Applicant: SIGNIFY HOLDING B.V., Eindhoven (NL)

(72) Inventor: Oliver Dross, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 15/543,258

(22) PCT Filed: Jan. 6, 2016

(86) PCT No.: PCT/EP2016/050128
§ 371 (c)(1),
(2) Date: Jul. 13, 2017

(87) PCT Pub. No.: WO2016/116290
PCT Pub. Date: Jul. 28, 2016

(65) Prior Publication Data
US 2018/0017717 A1    Jan. 18, 2018

(30) Foreign Application Priority Data
Jan. 19, 2015 (EP) ................................... 15151572

(51) Int. Cl.
*H01L 31/0232* (2014.01)
*H01L 33/58* (2010.01)
(Continued)

(52) U.S. Cl.
CPC ............ *G02B 3/0062* (2013.01); *F21V 5/007* (2013.01); *F21V 5/008* (2013.01); *F21V 13/12* (2013.01);
(Continued)

(58) Field of Classification Search
CPC .. G02B 3/0043; G02B 3/0056; G02B 3/0062; G02B 3/0068; F21V 5/004
See application file for complete search history.

(56) References Cited

U.S. PATENT DOCUMENTS 4,619,508 A * 10/1986 Shibuya ............... G02B 3/0056
353/122
5,098,184 A * 3/1992 van den Brandt ....... G02B 3/00
353/102
(Continued)

FOREIGN PATENT DOCUMENTS

WO    WO9722032 A1    6/1997
WO    WO2008043491 A2    4/2008
(Continued)

OTHER PUBLICATIONS

O. Dross, et al., "Kohler Integrators Embedded into Illumination Optics Add Functionality", Proc. of SPIE vol. 7103, pp. 71030G-1 to 71030G-12.

*Primary Examiner* — Alexander K Garlen
(74) *Attorney, Agent, or Firm* — Akarsh P. Belagodu

(57) ABSTRACT

An optical device (100) is disclosed, comprising a collimator (110) and a first lenslet array (130, 430) and a second lenslet array (140, 440). The first lenslet array and the second lenslet array are provided with the same tessellation pattern, aligned with each other and arranged such that a projection (150) of a light source (122) is focused on the second lenslet array, which is configured to emit non-focused light. At least some of the lenslets of the second array are formed such that a ratio of their sagittal and meridional dimensions varies at least along the meridional direction (M) of the second lenslet array, based on the varying shape of the projection of the light source as seen by said lenslets, so as to achieve an improved mixing, intensity and uniformity of light emitted from the optical device.

18 Claims, 5 Drawing Sheets

(51) Int. Cl.
*G02B 27/30* (2006.01)
*G02B 27/09* (2006.01)
*G02B 19/00* (2006.01)
*G02B 3/00* (2006.01)
*F21V 5/00* (2018.01)
*F21V 13/12* (2006.01)

(52) U.S. Cl.
CPC ......... *G02B 3/0043* (2013.01); *G02B 3/0068* (2013.01); *G02B 19/0028* (2013.01); *G02B 19/0061* (2013.01); *G02B 27/0961* (2013.01); *G02B 27/30* (2013.01); *H01L 31/0232* (2013.01); *H01L 33/58* (2013.01)

(56) References Cited

U.S. PATENT DOCUMENTS

| | | | | |
|---|---|---|---|---|
| 8,721,088 B2* | 5/2014 | Kang | ................... | G02B 3/0043 353/38 |
| 8,757,849 B2* | 6/2014 | Brick | ................... | G02B 3/0006 362/311.01 |
| 2010/0039819 A1* | 2/2010 | Fournier | ................. | F21V 14/06 362/268 |
| 2011/0188242 A1 | 8/2011 | Brick et al. | | |
| 2013/0194811 A1* | 8/2013 | Benitez | ..................... | F21V 5/04 362/311.1 |
| 2013/0322075 A1* | 12/2013 | Hadrath | ............. | G02B 27/0961 362/235 |
| 2015/0219304 A1* | 8/2015 | Piehler | ................... | F21V 5/004 362/311.01 |

FOREIGN PATENT DOCUMENTS

| | | |
|---|---|---|
| WO | WO2009065389 A1 | 5/2009 |
| WO | WO2012107097 A1 | 8/2012 |
| WO | WO2013149139 A1 | 10/2013 |
| WO | WO2014076020 A1 | 5/2014 |

* cited by examiner

OPTICAL DEVICE WITH A COLLIMATOR AND LENSLET ARRAYS

CROSS-REFERENCE TO PRIOR APPLICATIONS

This application is the U.S. National Phase application under 35 U.S.C. § 371 of International Application No. PCT/EP2016/050128, filed on Jan. 6, 2016, which claims the benefit of European Patent Application No. 15151572.3, filed on Jan. 19, 2015. These applications are hereby incorporated by reference herein.

FIELD OF THE INVENTION

The present invention generally relates to the field of illumination devices. More precisely, the invention relates to an optical device having a collimator and a first lenslet array and a second lenslet array arranged to receive collimated light, and to a method for manufacturing such device.

BACKGROUND OF THE INVENTION

There is a growing interest in new optical devices having an improved efficiency in terms of energy consumption, colour mixing and illumination uniformity. Collimators are known to be used in many illumination applications to produce a desired illumination pattern beam angle. However, many collimators tend to reproduce at least part of the spatial structure of the light source. Non-uniform light sources such that e.g. light emitting diode (LED) arrays and LEDs of different colours may hence cause artefacts visible in the resulting light beam and beam spot when combined with a collimator.

Existing optical devices may therefore comprise mixing means, such as a lenslet arrangement, which is added to the collimator so as to further mix the light and to reduce artefacts caused by the light source. WO 2012/107097 shows an example of such lenslet arrangement, wherein two nearly mirror symmetric lenslet structures are provided for improving the mixing of coloured light emitted from LEDs of different colour. The lenslet structures are arranged above each other in a vertical direction, i.e. the direction of the emitted light, and slightly offset to each other in a lateral direction to reduce any artefactual irregularities in the light beam.

Although such a lenslet arrangement may provide mixed light, there is a need for alternative optical devices having enhanced light intensity and allowing for an emitted light beam having a more narrow beam angle.

U.S. 2011/0188242 discloses an optical component in which light from light sources is collimated by a collimator and transmitted to the lens with a first and a second lenslet structure, the light being focused by the first lenslet structure on the second lenslet structure.

In "Köhler integrators embedded into illumination optics add functionality" by O. Dross et al (Proceedings of SPIE, Vol. 7103, 2008) an overview is given of the Köhler illumination concept and its application to different kind of optics.

SUMMARY OF THE INVENTION

It would be advantageous to achieve an optical device overcoming, or at least alleviating, the above mentioned drawbacks. In particular, it would be desirable to achieve an optical device capable of emitting light forming a more narrow light beam and having a higher light intensity.

To better address one or more of these concerns, an optical device and a method for manufacturing an optical device having the features defined in the independent claims are provided. Preferable embodiments are defined in the dependent claims.

Hence, according to a first aspect, an optical device is provided which comprises a collimator adapted to collimate light from a light source, a first lenslet array comprising a plurality of first lenslets, and a second lenslet array comprising a plurality of second lenslets. The first lenslet array and the second lenslet array are arranged such that a tessellation of the first lenslet array coincides in terms of pattern and lenslet size with a tessellation of the second lenslet array. Further, the tessellation pattern of the first lenslet array is aligned with the tessellation pattern of the second lenslet array. The first and the second lenslet array is arranged such that light collimated by the collimator provides a projection of the light source, wherein the shape of the projection varies as seen at least along a meridional direction of the collimator, and such that the projection of the light source is focused by the first lenslet array at the second lenslet array. At least some (preferably a majority) of the second lenslets are formed such that a ratio of their sagittal and meridional dimensions varies at least along the meridional direction of the second lenslet array, adapted to the varying shape of the projection of the light source.

According to a second aspect, a method for manufacturing an optical device is provided. The method comprises providing an optical collimator adapted to collimate light from a light source, and arranging a first and a second lenslet array comprising a plurality of first and second lenslets, respectively. The first and second lenslet arrays are arranged such that a tessellation of the first lenslet array coincides in terms of pattern and lenslet shape with a tessellation of the second lenslet array, and such that the tessellation pattern of the first lenslet array is aligned with the tessellation pattern of the second lenslet array. The first and second lenslet arrays are also arranged such that light collimated by the collimator provides a projection of the light source, wherein the shape of the projection varies as seen at least along a meridional direction of the collimator, and such that the projection of the light source is focused by the first lenslet array at the second lenslet array. A ratio between the sagittal and meridional dimensions of each one of at least some of the first lenslets is varied adapted to the varying shape of the projection.

According to a third aspect, a lighting device is provided which comprises a light source and an optical device according to the first aspect.

The present aspects makes use of an understanding that the projection of a light source, or the cone angle of light emitted by the light source, may vary over a given plane above or at the exit opening of a collimator. This variation may e.g. depend on the symmetry or type of collimator, and the type and position of the light source. The inventors have realised that a first lenslet array can be arranged such that the projection of the light source impinges on the first lenslet array and is focused on the second lenslet array by the first lenslet array. By arranging the second lenslet array (at least approximately) in the focal plane of the first lenslet arrays, a Köhler integration is enabled which may improve the homogeneity and mixing of light emitted from the light source via the second lenslets. Further, the shape of at least some of the second lenslets may vary over the exit opening of the collimator based on the varying shape of the projection of the light source as seen by each one of said second lenslets. By adjusting the ratio between the sagittal and meridional dimensions of a lenslet, its shape can be adopted or fitted (within the limits set by the tessellation) to the outline of the projection of the light source. Providing a lenslet with a shape conforming, preferably as close as possible, to the shape or lateral extension or extent of the projected light source allows for each spot within the extension of the projected light source to contribute to a relatively large portion of a far field beam. Similarly, the active area of each lenslet, i.e. the area actually participating in the illumination task as compared with the area not participating in the illumination task, can be increased accordingly. This is advantageous in that it may reduce étendue dilution and beam width, thereby increasing light intensity of the optical device and improve the light mixing. The resulting light beam generated by the optical device may thus be formed by the sum of the light from each one of the at least some second lenslets, wherein the contribution from each one of those second lenslets may be superposed or overlapped to form the resulting, relatively uniform light beam in the far field.

Theoretically, an ideal correspondence in shape of a second lenslet and the light source as imaged by said second lenslet would conserve étendue and light intensity distribution of the collimator, even though it would be fully mixed by the first and second lenslet arrays. It should however be stressed that this is a theoretical reasoning that is difficult to realise due to the geometric limitations of a tessellated pattern. However, the present aspects allow for an optical device having a lenslet configuration that, compared with the above prior art devices, is closer to the ideal situation. It should however be noted that at least some of the second lenslets in some embodiments may have a lateral extension that is larger than the projected light source, thereby allowing for a relatively wide light beam to be emitted from the lighting device.

The present aspects are also advantageous in that the Köhler arrangement of the first lenslet array and the second lenslet array allows for the image of the light source to be defocused at least in a plane intersecting the light beam in the far field, or, in other words, to be diffused along the light beam. Any spatial structure or inhomogeneity of the light source may hence be reduced in the resulting beam. The first and the second lenslet arrays may be formed by first and second lenslets, respectively, being closely fitted together, preferably without gaps or overlapping, in order to reduce artefacts that can otherwise be introduced in the intensity pattern by edges, borders and spatial gaps in the lenslet arrays. The lenslets may e.g. comprise polygonal shapes, such as triangles, rectangles, pentagons, hexagons, etc., or any other shapes that can be tessellated into a one or two dimensional lenslet array.

The first and second lenslet arrays may be provided with the same tessellation, i.e. having lenslets that are similarly shaped and arranged in a similar pattern. The first and second lenslets arrays may also be laterally aligned with each other, i.e. superposed in the direction of the optical path, such that an optical axis of a first lenslet of a particular shape (at least substantially) coincides with an optical axis of a corresponding second lenslet of the same shape. Hence, the first and second lenslet arrays may be arranged in a mirrored configuration. Aligning two lenslet arrays having the same tessellation, or being mirror images of each other, is advantageous in that it reduces the risk for optical losses and artefacts stemming from boundaries between adjacent lenslets of the first lenslet array. The tessellated first lenslet may also coincide in size with the tessellated second lenslets.

Each one of the first and second lenslet arrays may have an extension in a direction extending away from a centre of the first and second lenslet array, respectively. This direction may be referred to as the meridional direction. Further, the first and second lenslet arrays may have an extension in a direction perpendicular to the meridional direction. This direction may be referred to as the sagittal direction. Hence, the shape of a lenslet can be at least partially described by a ratio of its sagittal and meridional dimensions.

It should be noted that since the first and second lenslet arrays may be provided with the same tessellation, measures and features related to the first lenslet array are also applicable to the second lenslet array and vice versa. For example, from adjusting the ratio of the sagittal and meridional dimensions of a first lenslet also follows a similar adjustment of a ratio of the sagittal and meridional dimensions of the corresponding second lenslet, and vice versa.

It will be appreciated that the projection of the light source being focused by the first lenslet array at the second lenslet array, may not necessarily imply that the projection must be focused by the first lenslet array exactly on the second lenslet array, but at least close to the second lenslet array. For example, a distance between the first lenslet array and a curved (or in any other way optically configured) surface of the second lenslets may differ from a focus length of the first lenslet array by less than 10%.

According to an embodiment, the sagittal and meridional dimensions, respectively, of at least some of the second lenslets may be varied such that they correspond to the sagittal and meridional dimensions, respectively, of the projection of the light source as seen at each one of said at least some second lenslets. A second lenslet may hence be formed such that the outer contour of the light source as seen by that lenslets is fitted within its contour. In one example, the maximum sagittal and meridional dimensions of a second lenslet may be (at least almost) equal to the maximum sagittal and meridional dimensions of the corresponding light source projection. The present embodiment is advantageous in that it allows for the entire lateral extension of said second lenslets to participate in the illumination, thereby increasing the on-axis intensity of the emitted light.

According to an embodiment, at least some of the first and second lenslets may be arranged to form concentric circles around an optical axis of the collimator. Concentric circles are advantageous in that they may be arranged to share the rotational symmetry of a rotationally symmetric collimator. Such correspondence in symmetry may facilitate the task of adapting the shape of the second lenslets to the varying shape of the light source projection generated by the collimator. In one example, an angular orientation of neighbouring circles may be shifted or adjusted so as to reduce the risk for boundaries between lenslets of adjacent different circles to be rotationally aligned and thus form aligned images that may cause artefacts in the intensity pattern.

According to an embodiment, sagittal and meridional dimensions of at least some of the second lenslets forming a first one of the concentric circles may be constant within said first one of the concentric circles and differs from the sagittal and meridional dimensions of the second lenslets in another one of the concentric circles. In other words, a first circle of second lenslets may be formed of lenslets having the same shape (or at least the same sagittal and meridional dimensions). Another circle may however be formed of second lenslets having a shape differing from the shape of the lenslets of the first circle. The configuration of the present embodiment is however not limited to two circles. On the contrary, it may apply to a plurality of circles or even the entire second lenslet array. That is, the second lenslets may be (at least almost) equally shaped within each circle and may differ between different circles.

According to an embodiment, the ratio of the sagittal and meridional dimensions of the second lenslets forming a first one of the concentric circles may be constant within said first one of the concentric circles and may be lower than a ratio of the sagittal and meridional dimensions of the second lenslets in another one of the concentric circles arranged outside of the first one of the concentric circles. This embodiment may be similar to the previous embodiment except that the sagittal dimensions of the lenslets, or the ratio of the sagittal and meridional dimensions of the lenslets, may be increased with an increased distance from the optical axis of the collimator.

According to an embodiment, at least some of the second lenslets may be arranged in concentric circles having the same number of second lenslets, and at least some of the second lenslets may have the same meridional dimensions, and may have sagittal dimensions that vary between said concentric circles having the same number of second lenslets. The second array may hence comprise two or several concentric circles of the same number of second lenslets, wherein the sagittal dimension of the second lenslets may be increased in the meridional direction of the second lenslet array so as to maintain the tessellation.

According to an embodiment, at least some of the second lenslets may be shaped as circle annulus sectors together forming the concentric circles. In one example, a vertical step (in the direction of an optical axis of the collimator) may be formed at the boundary between the adjacent second lenslets. The present embodiment is advantageous in that it allows for the number of quadrangular second lenslets as well as the symmetry of the second lenslet array to be increased, thereby increasing the number of lenslets being adapted to the shape of the projection of the light source.

According to an embodiment, the ratio of the sagittal and meridional dimensions of each one of at least some of the plurality of second lenslets may be different from 1. The lenslets may e.g. be oval or oblong in the meridional or sagittal direction so as to allow for oval or elliptic projections of the light source to be fitted within the lenslets.

According to an embodiment, the first and second lenslet arrays may be comprised in a single optical body. The optical body may e.g. comprise an at least partly light transmitting material such as glass, plastic, ceramics or a polymer. The material may preferably be chosen so as to achieve a desired refraction index. A relatively high refraction index may e.g. allow for the thickness or distance between the first and second lenslet arrays to be reduces so as to provide a smaller optical device.

According to an embodiment, the first and second lenslet arrays may be comprised in separate optical bodies. The first lenslet array may e.g. be arranged on a first substrate and the second lenslet array may be arranged on a second substrate. The separate optical bodies may e.g. be separated by an air gap, the width of which can be adjusted so as to adjust the focus and/or projection of the light source on the second lenslet array. Using an air gap may advantageously reduce the weight and possibly material cost of the optical device.

According to an embodiment, a distance between each one of at least some of the plurality of the first lenslets and the second lenslet array may vary at least along the meridional direction of the second lenslet array. Advantageously, the variation of the distance is based on the varying shape of the projection of the light source focused on the second lenslet array by the first lenslet array. In one example, the distance may be increased from one lenslet to another so as to compensate for a reduced angular extension of the projected light source such that the lenslet size, in meridional and/or sagittal direction(s), can be maintained. The focal length of the lenslets may be adjusted to the distance between the first and second lenslet array.

According to an embodiment, the first lenslet array may be integrally formed with the collimator. The first lenslet array may e.g. be manufactured in the same manufacturing process as the collimator, which advantageously may reduce the number of required processing steps.

According to an embodiment, the first and second lenslet arrays may be arranged (such as manufactured) by determining the sagittal and meridional dimensions of the projection of the light source on the first lenslet array, and by varying the sagittal and meridional dimensions of each one of at least some of the plurality of second lenslets based on the determined sagittal and meridional dimensions of the projection. The sagittal and meridional dimensions, or, in other words, the sagittal and meridional spread, of the light cones or the projection of the light source over the exit opening of the collimator may e.g. be determined by means of geometrical calculations or by ray-tracing of the collimator.

According to an embodiment, during operation, light may be emitted by the light source, collimated in the collimator, and mixed by the first and a second lenslet arrays arranged to form a Köhler integrator. The first lenslet array may comprise a plurality of first lenslets which may be adapted to focus the projection of the light source at the second lenslet array, which may comprise a plurality of second lenslets having a shape based on the shape or extension of the projection of the light source. The light emitted from the light source may be transmitted through the second lenslet array and emitted from the optical device in the form of a light beam. By adapting the shape of the second lenslets to the shape of the projection of the light source (obeying the geometrical rules set by the tessellation), and by arranging the first lenslets according to the same tessellation, light mixing can be improved and étendue dilution and optical artefacts may be reduced.

In the context of the present application, the term 'light source' refers to any light emitting area, device or element that can be projected on the first lenslet array by the collimator. It can also refer to a particular area of interest, within which light is emitted. Such an area may also be called 'integration zone', which should be understood as the area which, as seen from a second lenslet, should be able to be inscribed within that particular lenslet. Such integration zone may have a size that is equal to or larger than an area defined by a perimeter or surface enclosing the light source or all light emitting elements forming the light source. The integration zone may e.g. have a shape conforming to the shape of a disk or a cylinder.

The light source may comprise LEDs. It will however be understood that the light sources may in principle comprise any kind of element that is able to generate and emit light. RGB LEDs may advantageously be used to enable dynamic colour light output from the lighting device. The light sources may be of the same type or different types.

The collimator may e.g. comprise Fresnel lenses, total internal reflection (TIR) lenses, Frensel TIR lenses, or be a RXI collimator or a UFO, parabolic or aspheric collimator. Advantageously, the collimator may rotational symmetric around its optical axis.

The first lenslet array and the second lenslet array may also be referred to as an integrator or Köhler integrator. The first and second lenslets may preferably have a shape conforming to a circular disc, and may be arranged to fully cover an exit opening of the collimator. In particular, such circular Köhler integrator may be combined with a collimator that is rotational symmetric around the optical axis of the optical device.

The lenslets may e.g. be spherical or aspherical lenslets, cylindrical or Fresnel lenslets or provided with any other suitable curvature. The lenslet arrays may e.g. be formed by a glass, plastic, ceramic or polymeric material, which e.g. may be molded. Examples of molding techniques include e.g. blow molding, compression molding, injection molding and matrix molding. Molding is advantageous in that it may be suitable for large-scale production. Once the tools, such as the molds, are provided the lenslet arrays can be mass-produced in relatively large volumes and at a relatively low cost.

It is noted that embodiments of the invention relates to all possible combinations of features recited in the claims. Further, it will be appreciated that the various embodiments described for the optical device are all combinable with embodiments the method as defined in accordance with the second aspect.

BRIEF DESCRIPTION OF THE DRAWINGS

This and other aspects will now be described in more detail with reference to the appended drawings showing embodiments.

All the figures are schematic, not necessarily to scale, and generally only show parts which are necessary in order to elucidate the embodiments, wherein other parts may be omitted or merely suggested. Like reference numerals refer to like elements throughout the description.

DETAILED DESCRIPTION

The present aspects will now be described more fully hereinafter with reference to the accompanying drawings, in which currently preferred embodiments are shown. This invention may, however, be embodied in many different forms and should not be construed as limited to the embodiments set forth herein; rather, these embodiments are provided for thoroughness and completeness, and fully convey the scope of the present aspect to the skilled person.

Figure 1:
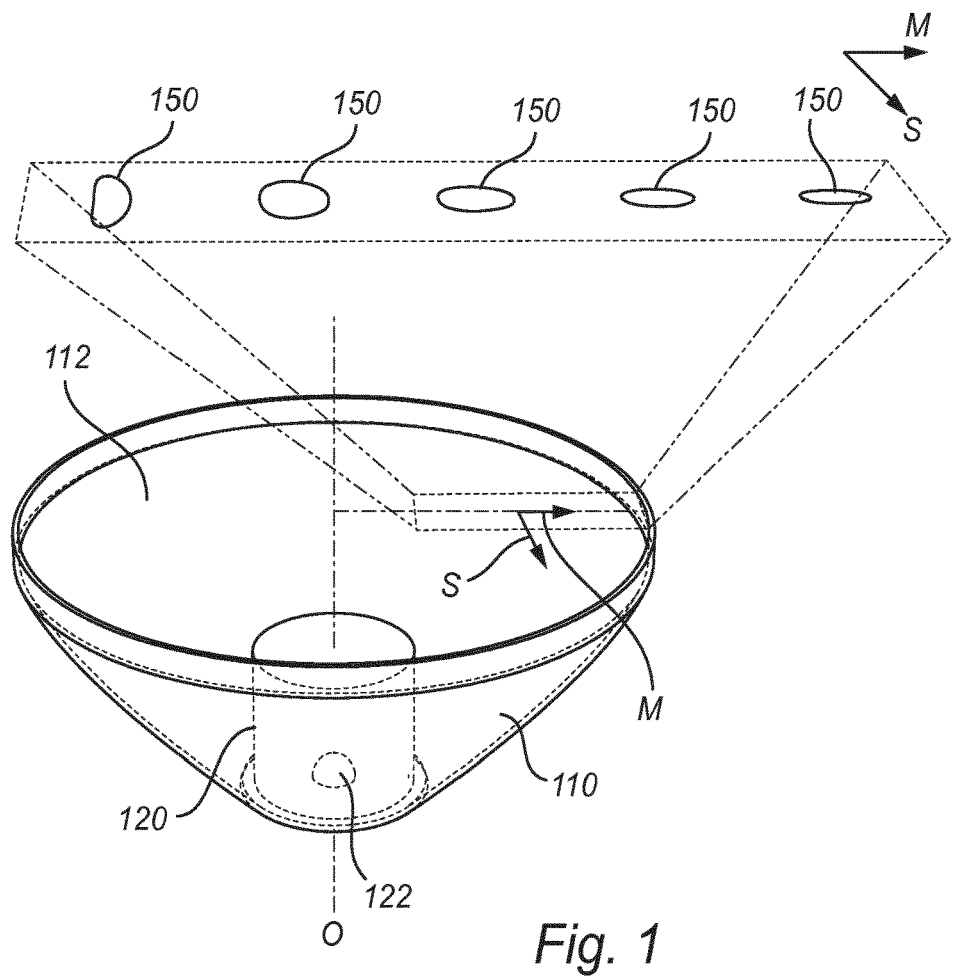
FIG. 1 shows a perspective view of a collimator of an optical device according to an embodiment.

FIG. 1 is a perspective view of a collimator 110 of an optical device according to an embodiment. The collimator 110 may be rotationally symmetric around its optical axis O and arranged to collimate light from a light source 122 comprising e.g. a LED 122. The light source 122 may e.g. be arranged within a cavity 120, which e.g. may comprise light refracting cylindrical sidewalls and a refractive top surface that may face an exit opening 112 of the collimator 110 and be formed as a convex lens configured to focus light exiting through the top surface. The collimated light exits through the collimator's exit opening 112, at which a first and a second lenslet array (not shown in FIG. 1) may be arranged so as to receive a projection 150 of the light source 122 and to mix the light to be emitted from the optical device. An image or projection of the light source 122 may be produced on a given plane parallel to exit opening 112 of the collimator 110. The exemplary outlines of such projections 150, as seen in a plane coinciding with the exit opening 112 of the collimator 110, are illustrated at a few positions along a meridional direction M of the collimator 110. The meridional direction M should be understood as any line passing through the optical axis O and extending in a plane perpendicular to the optical axis O, whereas a sagittal direction S should be understood as any line extending in a plane perpendicular to the optical axis O and being orthogonal to the meridional direction M. As shown in FIG. 1, the outline or shape of the projection 150 the light source 122 may vary along the meridional direction M of the collimator 110. In this particular example, the sagittal dimension of the projection 150 varies when going in a direction towards the optical axis O of the collimator 110, such that a ratio of the sagittal dimension to the meridional dimension of the projection 150 of the light source 122 increases with a decreasing distance to the optical axis O.

Figure 2:
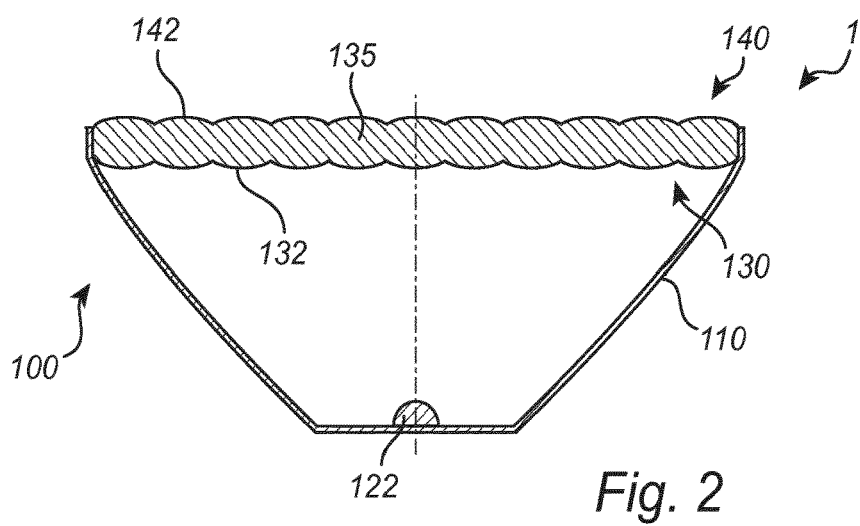
FIG. 2 shows a cross sectional side view of a lighting device according to an embodiment.

FIG. 2 is a cross sectional side view of a lighting device 1 according to an embodiment, comprising a light source 122 and an optical device 100 which may be similarly configured as the optical device described with reference to FIG. 1. As shown in FIG. 2, the optical device 100 comprises a collimator or reflector 110 and a first lenslet array 130 and a second lenslet array 140 of tessellated first and second lenslets 132, 142 respectively. In the present example, the first and second lenslet arrays 130, 140 are comprised in a single optical body 135, which e.g. may be a plastic, disc shaped substrate 135. The first lenslet array 130 and the second lenslet array 140 may be arranged on opposing sides of the substrate 135. The first lenslet array 130 may comprise a plurality of first lenslets 132 which are tessellated, i.e. arranged side by side with no lateral gaps or overlaps. This also applies for the second lenslet array 140, which has a tessellation that coincides in terms of pattern and lenslet shape with the tessellation of the first lenslet array 130. The second lenslet array 140 may be vertically arranged above the first lenslet array 130 in the direction of the optical path (and optical axis O), and laterally aligned with the first lenslet array 130 such that each one of the first and second lenslets 132, 142 are superposed. A lateral direction of the optical device 100 means any direction orthogonal to the optical axis O of the optical device 100.

The first and second lenslets 132, 142 may be formed so as to allow the projection 150 of the light source 122 to be focused by the first lenslet array 130 on the outer surface of the second lenslet array 140. According to the present embodiment, the lenslets may e.g. be spherical or aspherical, and have a radius based on the index of refraction and thickness of the optical body 135.

The first and second lenslets 132, 142 may e.g. be formed as polygons with a sagittal and meridional extension that varies with the varying shape of the projection or image 150 of the light source 122 as seen from each one of the second lenslets 142. By adjusting the ratio of the sagittal and meridional dimensions of the second lenslets 142 as a function of their meridional and sagittal position over the exit opening 112 of the collimator 110, a tessellation can be provided which allows a reduced étendue dilution of the optical device 100, at least as compared to light mixing based on diffusion and/or a single lenslet array.

Figure 3A:
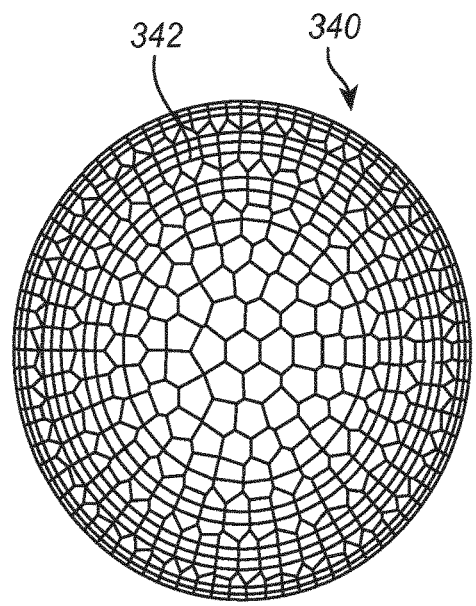
FIGS. 3a-d show different examples of tessellated lenslets according to some embodiments.

FIG. 3a is a schematic top view of a second lenslet array 340 having second lenslets 342 that are tessellated in a pattern wherein the meridional and sagittal dimensions may vary according to the cone angles, or the light source projections 350 that is focused on the second lenslets 342 by the first lenslets 332. As shown in FIG. 3a, the second lenslets 342 may be arranged in concentric circles around a centre of the second lenslet array 340, which centre may be arranged to coincide with the optical axis O of the collimator 310. The second lenslets 342 may be arranged side by side without lateral gaps or vertical steps. Each ring of second lenslets 342 may be formed of lenslets having the same shape. Further, some neighbouring rings may comprise the same number of second lenslets 342 and having the same meridional dimension. Hence, the sagittal dimension of the second lenslets 342 may be varied between adjacent rings having the same number of lenslets so as to compensate the varying circumference of the rings and to maintain the tessellation.

Figure 3B:
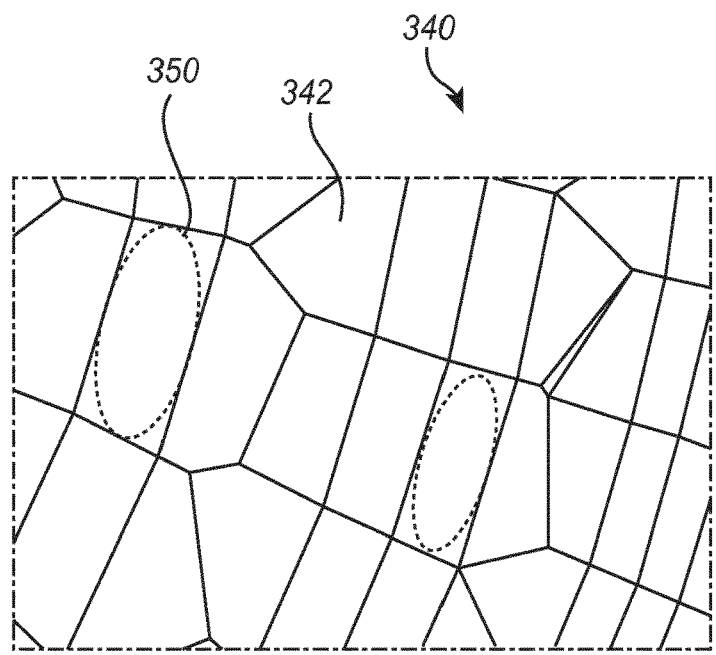

FIG. 3b illustrates a portion of the second lenslet array 340 of FIG. 3a, wherein the outline of the projection of the light source 310 is illustrated in two different second lenslets 342, the sagittal and meridional dimensions of which have been adjusted to the shape of the projected light source 310.

Figure 3C:
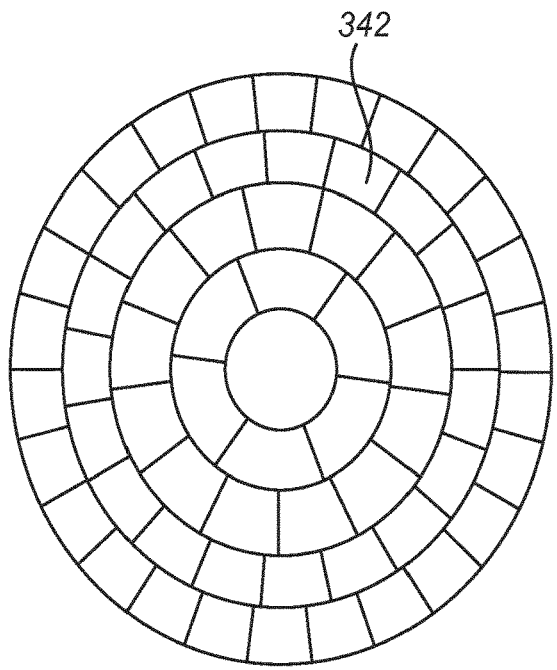
Figure 3D:
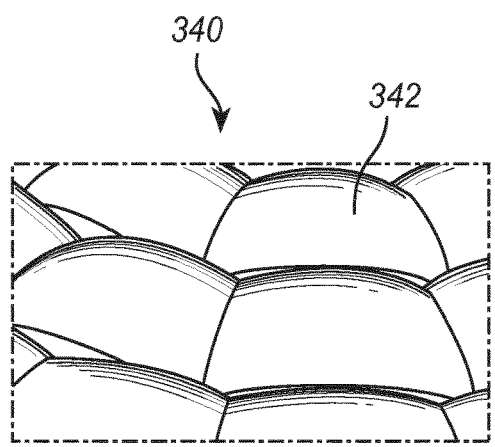

FIGS. 3c and d show a similar lenslet array as the one described with reference to FIG. 3a, comprising concentric rings of quadrangular second lenslets 342 shaped as circle annulus sectors, which are not being strictly arranged corner to corner, and wherein vertical steps are allowed between adjacent lenslets. The vertical steps between adjacent second lenslets 342 are illustrated in the perspective view in FIG. 3d. As a consequence, the number second lenslets 342 that are well adjusted to the shape of the projected light source 310 may be increased.

Figure 4A:
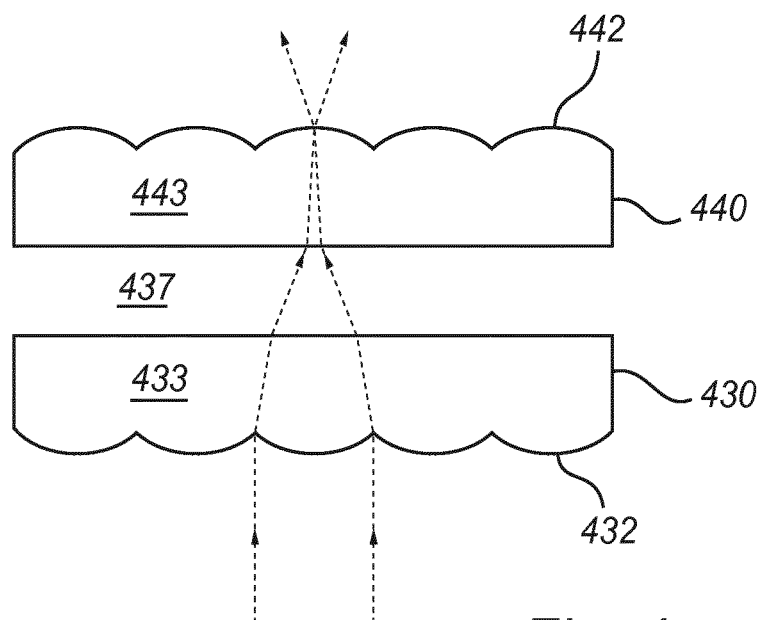
FIGS. 4a-c show cross sectional side views of first and second lenslet arrays according to some embodiments.
Figure 4B:
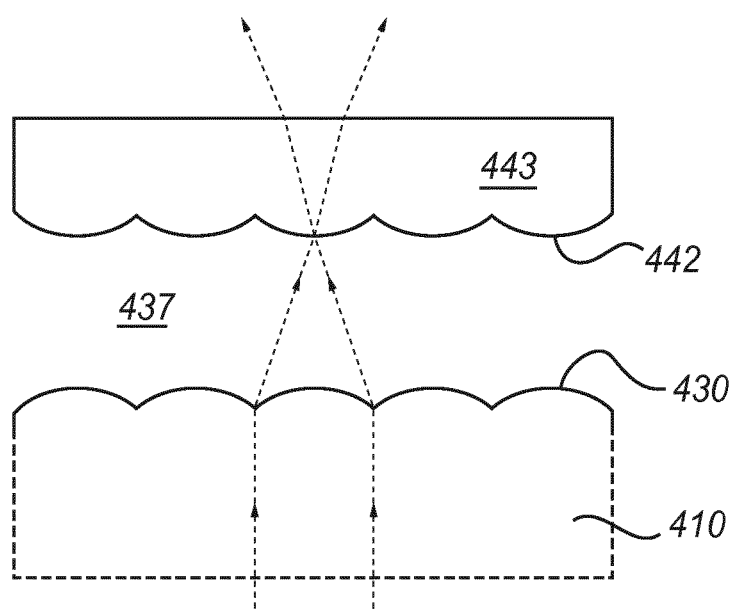
Figure 4C:
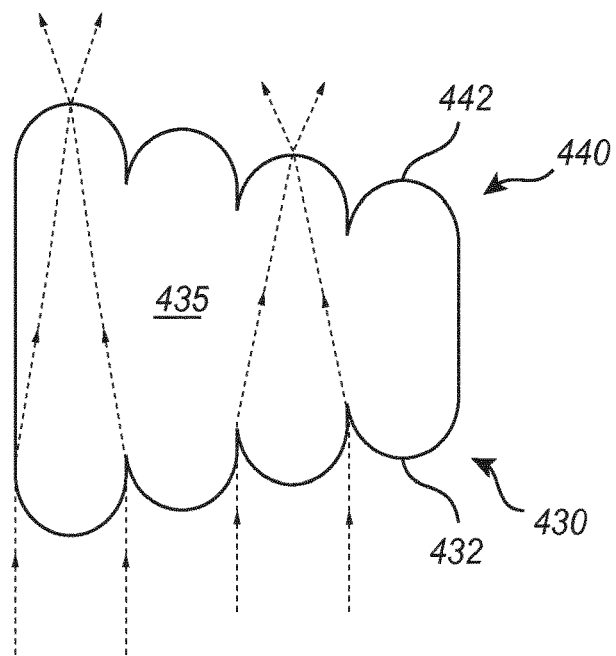

FIGS. 4a-c show cross sections of different examples of first lenslet arrays 430 and second lenslet arrays 440 similar to the lenslet arrays described with reference to FIGS. 2 and 3a-d. The arrows indicate the path of light impinging on the first lenslet array 130 and being focused on the second lenslet array 440.

FIG. 4a shows a first lenslet array 430 and a second lenslet array 440 which may be arranged on separate optical bodies. The first lenslet array 430 may e.g. be formed on a first substrate 433, which is separated from a second substrate 443, on which the second lenslet array 440 is formed. The first and second substrates 433, 443 may be separated by an air gap 437. In this embodiment, the first lenslet array 430 is facing away from the second lenslet array 440.

In FIG. 4b, a similar arrangement as in FIG. 4a is disclosed, but the first lenslet array 430 is integrally formed with the collimator 410. Further, the first and second lenslet arrays 430, 440 are arranged to face each other.

FIG. 4c shows a further example of a first and second lenslet array 430, 440 which are comprised in a single optical body 435. According to this example, the thickness of the optical body 435 in the direction of the optical path (optical axis) may be varied so as to vary the distance between at least some (preferably a majority) of the first lenslets 432 and the second lenslets 442. The thickness may e.g. vary along the meridional direction M of the second lenslet array, and/or in the sagittal direction S, so as to vary the meridional and sagittal dimensions M, S of the projected light source.

Figure 5:
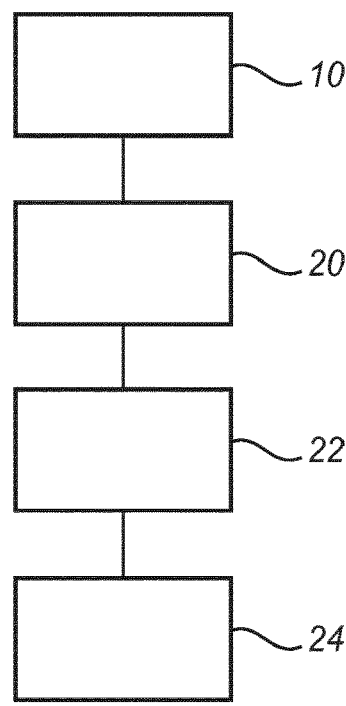
FIG. 5 is a schematic illustration of a method according to an embodiment.

FIG. 5 is a schematic illustration of a method for manufacturing an optical device similar to the devices as described with reference to the previous figures. According to the present embodiment, an optical collimator is provided 10 that is adapted to collimate light from a light source. The collimated light provides a projection of the light source at an exit opening of the collimator, wherein the shape of the projection varies at least along a meridional position at the first exit opening. Further, a first and a second lenslet array is arranged 20, which may comprise a plurality of first and second lenslets, respectively. The arranging 20 may comprise determining 22 a sagittal and meridional dimension of the projection of the light source, e.g. by means of a geometrical calculation or ray-tracing. The first and second lenslet arrays are formed 24 such that a ratio of sagittal and meridional dimensions of each one of the second lenslets is varied based on the determined sagittal and meridional dimensions of the projection of the light source. The first and second lenslet arrays are tessellated such that the tessellation of the first lenslet array coincides in terms of pattern and lenslet shape with the tessellation of the second lenslet array, and such that the tessellation pattern of the first lenslet array is aligned with the tessellation pattern of the second lenslet array. Further, the first lenslet array is arranged to focus the projection of the light source at the second lenslet array.

With reference again to FIG. 1, during operation, light emitted from the light source 122 can be collimated by the collimator 110, received by the first lenslets 132 of the first lenslet array 130, focused at the corresponding lenslets 142 of the second lenslet array 140, mixed and emitted from the optical device 100 via the second lenslet array 140.

The person skilled in the art realizes that the present invention by no means is limited to the preferred embodiments described above. On the contrary, many modifications and variations are possible within the scope of the appended claims. For example, the first and second lenslet arrays may be provided with different shapes, materials and lenslet types. Additional optical elements, such as focusing lenses, filters etc may also be combined with embodiments of the present invention.

Additionally, variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:
1. A lighting device comprising a light source and an optical device, said optical device comprising:
  an optical collimator adapted to collimate light from a light source;
  a first lenslet array comprising a plurality of first lenslets; and
  a second lenslet array comprising a plurality of second lenslets;
  wherein the first lenslet array and the second lenslet array are arranged such that:
    a tessellation of the first lenslet array coincides in terms of pattern and lenslet shape with a tessellation of the second lenslet array;

the tessellation pattern of the first lenslet array is aligned with the tessellation pattern of the second lenslet array; and such that light collimated by the optical collimator provides a projection of the light source, the shape of the projection varying as seen at least along a meridional direction of the collimator;

wherein the projection of the light source is focused by the first lenslet array at the second lenslet array;

wherein a ratio of sagittal and meridional dimensions of each one of at least some of the second lenslets increases towards an optical axis of the collimator at least along a meridional direction of the second lenslet array adapted to the varying shape of the projection, wherein at least some of the second lenslets are arranged to form concentric circles around the optical axis of the collimator and are shaped as circle annulus sectors together forming the concentric circles, the meridional dimension being in the meridional direction which is defined by any line passing through the optical axis and extending in a plane perpendicular to the optical axis, the sagittal dimension being in a sagittal direction which is defined by any line extending in a plane perpendicular to the optical axis and being orthogonal to the meridional direction.

2. The lighting device according to claim 1, wherein the sagittal and meridional dimensions, respectively, of each one of at least some of the second lenslets are varied such that they correspond to the sagittal and meridional dimensions, respectively, of the projection of the light source as seen at each one of said at least some second lenslets.

3. The lighting device according to claim 1, wherein the sagittal and meridional dimensions of the second lenslets forming a first one of the concentric circles are constant within said first one of the concentric circles and differs from the sagittal and meridional dimensions of the second lenslets in another one of the concentric circles.

4. The lighting device according to claim 3, wherein a ratio of the sagittal and meridional dimensions of the second lenslets forming a first one of the concentric circles are constant within said first one of the concentric circles and is lower than a ratio of the sagittal and meridional dimensions of the second lenslets in another one of the concentric circles arranged outside of the first one of the concentric circles.

5. The lighting device according to claim 3, wherein at least some of the second lenslets are arranged in concentric circles having the same number of second lenslets, and wherein said at least some of the second lenslets have the same meridional dimensions, and have sagittal dimensions that varies between said concentric circles having the same number of second lenslets.

6. The lighting device according to claim 1, wherein the ratio of the sagittal and meridional dimensions of each one of at least some of the second lenslets is different from 1.

7. The lighting device according to claim 1, wherein the first and second lenslet arrays are comprised in a single optical body.

8. The lighting device according to claim 1, wherein the first and second lenslet arrays are comprised in separate optical bodies.

9. The lighting device according to claim 1, wherein a distance between each one of at least some of the first lenslets and the second lenslet array varies at least along the meridional direction of the second lenslet array based on the varying shape of the projection of the light source focused on the second lenslet array.

10. The lighting device according to claim 1, wherein the first lenslet array is integrally formed with the collimator.

11. An optical device for use in the lighting device according to claim 1.

12. A method for manufacturing an optical device, the method comprising:
providing an optical collimator adapted to collimate light from a light source;
arranging a first and a second lenslet array comprising a plurality of first and second lenslets, respectively, such that:
a tessellation of the first lenslet array coincides in terms of pattern and lenslet shape with a tessellation of the second lenslet array;
the tessellation pattern of the first lenslet array is aligned with the tessellation pattern of the second lenslet array; and such that light collimated by the optical collimator provides a projection of the light source, the shape of the projection varying as seen at least along a meridional direction of the collimator;
wherein the projection of the light source is focused by the first lenslet array on the second lenslet array;
wherein a ratio between sagittal and meridional dimensions of each one of at least some of the first lenslets decreases towards an optical axis of the collimator at least along a meridional direction of the second lenslet array adapted to the varying shape of the projection, the meridional dimension being in the meridional direction which is defined by any line passing through the optical axis and extending in a plane perpendicular to the optical axis,
the sagittal dimension being in a sagittal direction which is defined by any line extending in a plane perpendicular to the optical axis and being orthogonal to the meridional direction; and
wherein at least some of the second lenslets are arranged to form concentric circles around the optical axis of the collimator and are shaped as circle annulus sectors together forming the concentric circles.

13. The method according to claim 12, wherein the step of arranging the first and second lenslet arrays further comprises:
determining sagittal and meridional dimensions of the shape of the projection as seen at a plurality of positions along the meridional direction of the collimator; and
forming the second lenslet array such that the sagittal and meridional dimensions of each one of at least some of second lenslets varies adapted to the determined sagittal and meridional dimensions of the projection.

14. A lighting device comprising a light source and an optical device, said optical device comprising:
an optical collimator adapted to collimate light from a light source;
a first lenslet array comprising a plurality of first lenslets; and
a second lenslet array comprising a plurality of second lenslets;
a tessellation pattern of the first lenslet array being aligned with a tessellation pattern of the second lenslet array such that light collimated by the optical collimator provides a projection of the light source, the shape of the projection varying as seen at least along a meridional direction of the collimator;
wherein the projection of the light source is focused by the first lenslet array at the second lenslet array;
wherein a ratio of sagittal and meridional dimensions of each one of at least some of the second lenslets varies at least along a meridional direction of the second lenslet array adapted to the varying shape of the projection;

wherein the sagittal and meridional dimensions of the second lenslets forming a first one of the concentric circles are constant within said first one of the concentric circles and differs from the sagittal and meridional dimensions of the second lenslets in another one of the concentric circles; and wherein said at least some of the second lenslets are shaped as circle annulus sectors together forming the concentric circles, the meridional dimension being in the meridional direction which is defined by any line passing through the optical axis and extending in a plane perpendicular to the optical axis, the sagittal dimension being in a sagittal direction which is defined by any line extending in a plane perpendicular to the optical axis and being orthogonal to the meridional direction.

15. The lighting device according to claim 14, wherein the first lenslet array and the second lenslet array are arranged such that the tessellation of the first lenslet array coincides in terms of pattern and lenslet shape with the tessellation of the second lenslet array.

16. The lighting device according to claim 14, wherein a distance between each one of at least some of the first lenslets and the second lenslet array varies at least along the meridional direction of the second lenslet array based on the varying shape of the projection of the light source focused on the second lenslet array.

17. The lighting device according to claim 14, wherein the first lenslet array is integrally formed with the collimator.

18. The lighting device according to claim 17, wherein the second lenslet array is integrally formed with the collimator and first lenslet array.

\* \* \* \* \*